US006984051B2

(12) United States Patent
Takino

(10) Patent No.: US 6,984,051 B2
(45) Date of Patent: Jan. 10, 2006

(54) MULTIFACETED REFLECTING MIRROR, ILLUMINATION OPTICAL SYSTEM BASED ON USE OF THE SAME, AND SEMICONDUCTOR EXPOSURE APPARATUS

(75) Inventor: Hideo Takino, Setagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/288,337

(22) Filed: Nov. 6, 2002

(65) Prior Publication Data

US 2003/0058555 A1    Mar. 27, 2003

Related U.S. Application Data

(63) Continuation of application No. PCT/JP02/01614.

(30) Foreign Application Priority Data

Feb. 23, 2001 (JP) ............................. 2001-047679
Feb. 23, 2001 (JP) ............................. 2001-047680

(51) Int. Cl.
*G02B 5/08* (2006.01)
*G02B 7/182* (2006.01)
(52) U.S. Cl. ..................................... 359/855; 359/903
(58) Field of Classification Search ................. 359/846, 359/849, 850, 851, 853, 855, 856, 857, 862, 359/865, 903; 472/63
See application file for complete search history.

(56) References Cited

U.S. PATENT DOCUMENTS 4,456,332 A * 6/1984 Anderson ................. 156/305
4,906,087 A * 3/1990 Ealey et al. .............. 359/849
5,204,731 A * 4/1993 Tanaka et al. ............ 356/3.09
5,347,402 A * 9/1994 Arbogast .................. 359/853

FOREIGN PATENT DOCUMENTS

EP    0 939 341 A2    9/1999
JP    52-041538    3/1977

(Continued)

OTHER PUBLICATIONS

Hoh et al., "Feasibility Study on the Extreme UV/Soft X-Ray Projection-type Lithography", Bulletin of the Electron technical Laboratory, vol. 49, No. 12, pp. 983-990, 1985.

(Continued)

*Primary Examiner*—Mark A. Robinson
(74) *Attorney, Agent, or Firm*—Oliff & Berridge PLC

(57) ABSTRACT

A multifaceted reflecting mirror is provided with a plurality of reflecting mirror elements 10 and a base plate 13 for magnet, each of the plurality of reflecting mirror elements 10 comprising a reflecting surface 19 and a magnetic film 17 formed on a bottom surface. The respective reflecting mirror elements 10 can be positioned highly accurately on the base plate 13 by using a positioning guide 15. The maintenance operation is easily performed as well, because the respective reflecting mirror elements 10 are detachable. When the multifaceted reflecting mirror is used in combination with another multifaceted reflecting mirror for an illumination optical system of a reflection type exposure apparatus which uses, as an exposure light beam, a light beam having a short wavelength such as soft X-ray, it is possible to illuminate an exposure area on a substrate with the light beam having an extremely uniform illumination intensity.

31 Claims, 18 Drawing Sheets

FOREIGN PATENT DOCUMENTS

| | | |
|---|---|---|
| JP | A 52-41538 | 3/1977 |
| JP | 60-232552 | 11/1985 |
| JP | A 60-232552 | 11/1985 |
| JP | 63-312640 | 12/1988 |
| JP | A 63-312640 | 12/1988 |
| JP | A 11-312638 | 11/1999 |
| JP | 2000-098114 | 4/2000 |
| JP | A 2000-98114 | 4/2000 |
| JP | A 2000-162415 | 6/2000 |

OTHER PUBLICATIONS

Hawryluk et al., "Soft x-ray beamsplitters and highly dispersive multilayer mirrors for use as soft x-ray laser cavity components", SPIE vol. 688, Multi-layer Structure and Laboratory X-ray Laser Research, pp. 81-90, 1986.

* cited by examiner (a)

(b)

(c)

(a)

(b)

(c)

(a)

(b)

(c)

(a)

(b)

(a)

(b)

(c)

(d)

(a)

(b)

(a)

(b)

MULTIFACETED REFLECTING MIRROR, ILLUMINATION OPTICAL SYSTEM BASED ON USE OF THE SAME, AND SEMICONDUCTOR EXPOSURE APPARATUS

CROSS-REFERENCE

This application is a Continuation Application of International Application No. PCT/JP02/01614 which was filed on Feb. 22, 2002 claiming the conventional priority of Japanese patent Application Nos. 2001-047679 filed on Feb. 23, 2001 and 2001-047680 filed on Feb. 23, 2001.

BACKGROUND OF THE INVENTION

1. Field of the Invention

The present invention relates to a multifaceted reflecting mirror comprising a plurality of reflecting mirror elements to be used for illuminating an object with a light beam having a uniform illuminance distribution, and a method for producing the multifaceted reflecting mirror. The present invention also relates to a reflection type illumination system to be used for illuminating an object with a light beam having a short wavelength of not more than 200 nm with a uniform illuminance distribution, and an exposure apparatus provided with the reflection type illumination system.

2. Description of the Related Art

At present, the research and development is actively performed in order to further narrow the line width of the circuit pattern in the production of semiconductor devices such as DRAM and MCP. Various techniques have been developed in order to realize line widths of 0.13 $\mu$m (4G DRAM), 0.1 $\mu$m (16G DRAM), and 0.07 $\mu$m (32G DRAM) as the design rule.

In general, when it is intended to narrow the line width of an exposure pattern by using a semiconductor exposure apparatus, a diffraction phenomenon is caused by the exposure light beam. The occurrence of any unintentional diffraction image and the occurrence of defocus of light collection point, which result from the diffraction phenomenon, become problems. In order to solve the problems, it is recommended that the numerical aperture (N.A.) of the exposure optical system is increased and the exposure wavelength is shortened.

However, if the wavelength of light is shortened, especially if the wavelength is not more than 200 nm, then it is difficult to get an optical material which has a low absorbance and which is excellent in workability. For this reason, a reflection type projection optical system has been developed in place of the conventional transmission type projection optical system. For example, the following method is known. That is, a circular arc-shaped optical field (area capable of being used as an exposure area) is realized for the soft X-ray by combining a plurality of reflecting mirrors. A comparted area (chip-forming area) on a substrate is subjected to the exposure by moving a mask and a wafer mutually synchronously at a relative velocity corresponding to the ratio of projection reduction magnification of a projection optical system. Koichiro Hoh and Hiroshi Tanino, "Feasibility Study on the Extreme UV/Soft X-ray Projection-type Lithography", Bulletin of the Electron technical Laboratory Vol. 49, No. 12, pp. 983–990, 1985.

for the semiconductor production based on the use of an exposure apparatus, it is demanded to improve the throughput as well as narrow the line width. Factors concerning the throughput include, for example, the light emission intensity of the light source, the efficiency of the illumination system, the reflectance of the reflecting mirror, and the sensitivity of the photosensitive material (photoresist) on the wafer. At present, those used as the light source include the ArF laser and the $F_2$ laser, as well as the synchrotron radiation beam and the laser plasma beam as the light source for the light beam having a shorter wavelength. A multilayered film-based reflecting mirror, which is used as a reflecting mirror to reflect the light beam as described above, is developed in order to maintain a high reflectance. For details of the multilayered film-based reflecting mirror, reference may be made to the literature written by Koichiro Hoh et al. described above; Andrew M. Hawryluk et al., "Soft x-ray beam splitters and highly dispersive multi-layer mirrors for use as soft x-ray laser cavity component", SPIE Vol. 688, Multi-layer Structure and Laboratory X-ray Laser Research (1986), pp. 81–90; and Japanese Patent Application Laid-open No. 63-312640.

The illumination optical system, which is used for the exposure apparatus, is also actively developed. In order to illuminate a master pattern (mask) uniformly without any unevenness, an illumination optical system, which successfully illuminate the master pattern uniformly irrelevant to the light amount distribution of the light source, has been developed. The uniform illumination performance and the aperture performance are required for the illumination optical system. For example, Japanese Patent Application Laid-open No. 60-232552 discloses a technique to generate a rectangular illumination area. The exposure apparatus is provided with a projection optical system for projecting the master pattern onto the wafer. However, the field of the projection optical system is usually circular arc-shaped. That is, the efficiency of use of light is low, because the shape of the field of the projection optical system is different from the shape of the field of the illumination optical system. This fact has exerted harmful influences on the exposure time and the throughput.

Nowadays, Japanese Patent Application Laid-open No. 11-312638 discloses a method for solving the foregoing problem, i.e., a method for setting an illumination field in conformity with a shape of a field of a projection optical system to improve the efficiency of use of light thereby. When this method is used, it is possible to realize an illuminating apparatus and an exposure apparatus provided with the same in which the illumination efficiency is remarkably higher than that of the conventional illuminating apparatus, it is possible to achieve a higher throughput, and it is possible to perform uniform illumination such as the Koehler illumination.

The technique, which is disclosed in Japanese Patent Application Laid-open No. 11-312638, will be explained with reference to FIG. 18. The light beam, which is radiated from a light source 201 of a projection exposure apparatus shown in FIG. 18, passes along a multifaceted reflecting mirror 202, a condenser optical element 203, and a reflecting mirror 204, and it illuminates a mask 205 which is held on a mask stage 205s. A pattern, with which a wafer 207 held on a wafer stage 207s is exposed, is formed as a reflector image on the mask 205. A reflected light beam (reflection pattern) from the illuminated mask 205 is projected onto the wafer 207 via a reflection type projection optical apparatus 206 comprising reflecting mirrors 206a, 206b, 206c, 206d. In this procedure, the optical field of the projection optical apparatus 206 is not so wide as to successfully cover the entire comparted area corresponding to the device chip on the wafer. Therefore, the pattern of the entire chip is formed on the wafer by performing the continuous exposure while synchronizing the mask 205 and the wafer 207 and relatively moving (scanning) them. Therefore, the exposure apparatus is provided with unillustrated laser interferometers for managing the positions of the mask stage and the wafer stage, and a mask stage controller 208 and a wafer stage controller 209 for controlling the driving of the stages. The relative movement of the mask and the wafer is controlled by them. Reference may be made to the literature written by Koichiro Hoh et al. described above for such a scanning type projection exposure system. In this arrangement, the multifaceted reflecting mirror 202 is constructed by arranging one type of or a plurality of types of minute reflecting mirror elements (reflecting surfaces) in accordance with a definite repeating pattern. It is necessary that the outer shape of the reflecting mirror element is similar to the shape of the optical field of the projection optical apparatus. Accordingly, a large number of point light source images I are formed in an approximately circular form at Position P2, and they form a necessary illumination field by the aid of the condenser optical element 203. When the technique as described above is used, then the area on the mask to be illuminated can be illuminated uniformly without any waste, and it is possible to shorten the exposure time. Thus, a semiconductor exposure apparatus having a high throughput is realized.

The present inventors have disclosed a method for producing a multifaceted reflecting mirror of the type as described above in Japanese Patent Application Laid-open No. 2000-162415. In this patent document, in order to form three types of different reflecting mirror elements A, B, C, circular arc-shaped bands (circular arc-shaped bands including circles having an average radius of Zh), which are parallel to the YZ plane, are cut out from a spherical surface having a radius of curvature R with an electric discharge wire at predetermined positions (pattern positions of A, B, C shown in FIGS. 4(*a*) to 4(*c*)) as shown in FIGS. 4(*a*) to 4(*c*) respectively. The reflecting mirror elements A, B, C, which have been cut out, are arranged in accordance with a predetermined pattern as shown in FIG. 6 to produce the multifaceted reflecting mirror thereby. However, in this patent document, there is no description about the way to secure the reflecting mirror elements on a base plate. In order to enhance the uniformity of the light beam for illuminating the mask therewith, it is necessary that the reflecting mirror elements are installed to the base plate with a high degree of positional accuracy.

A first object of the present invention is to provide a multifaceted reflecting mirror which comprises a plurality of reflecting mirror elements installed onto a base plate with a high degree of positional accuracy. A second object of the present invention is to provide a multifaceted reflecting mirror which is preferably irradiated with a light beam having an extremely short wavelength such as the soft X-ray. A third object of the present invention is to provide an exposure apparatus and an illumination optical system provided with the multifaceted reflecting mirror as described above.

SUMMARY OF THE INVENTION

According to a first aspect of the present invention, there is provided a multifaceted reflecting mirror comprising:

a plurality of reflecting mirror elements each of which is provided with a reflecting surface; and a placement plate which is joined to the reflecting mirror elements with magnetic force, wherein:

the reflecting mirror elements are arranged adjacently on the placement plate.

In the multifaceted reflecting mirror according to the present invention, the respective reflecting mirror elements are attached onto the placement plate (base plate) with the magnetic connection. The magnetic connection between the reflecting mirror elements and the placement plate makes it unnecessary to allow any adhesive or the like to intervene between the reflecting mirror elements and the placement plate. Therefore, the reflecting surfaces of the respective reflecting mirror elements can be positioned extremely highly accurately not only in the direction parallel to the placement plate but also in the direction perpendicular to the placement plate. Further, the position of the reflecting surface of each of the reflecting mirror elements is adjusted extremely easily in the plane of the placement plate, because the reflecting mirror elements are detachable with respect to the placement plate owing to the magnetic connection. Furthermore, after the use, it is easy to perform the maintenance operation such as washing and exchange of the individual reflecting mirror elements.

Especially, the multifaceted reflecting mirror of the present invention is effectively used in an exposure apparatus in which a vacuum ultraviolet light beam having a wavelength of not more than 200 nm, or an electromagnetic wave having a short wavelength in the soft X-ray region is radiated. It is required that the atmosphere of the exposure apparatus, in which the electromagnetic wave having the short wavelength is radiated as described above, is usually maintained in vacuum or in an inert atmosphere, in order to avoid any absorption of the electromagnetic wave by gas molecules. If the reflecting mirror elements are attached to the placement plate by using an adhesive, a problem arises such that adhesive components are evaporated to bring about any substance which absorbs the electromagnetic wave in the atmosphere. Such a problem is not caused by the multifaceted reflecting mirror of the present invention, because the respective reflecting mirror elements are attached onto the base plate with the magnetic connection.

In order to position the reflecting mirror elements on the placement plate, it is advantageous that the multifaceted reflecting mirror further comprises, on the placement plate, a positioning member (guide member or stopper) which determines a position of at least one of the reflecting mirror elements on the placement plate. When the reflecting mirror elements are arranged on the placement plate, then the first reflecting mirror element is positioned by pushing the reflecting mirror element against the positioning member, and the next reflecting mirror element is pushed against the reflecting mirror element having been allowed to make tight contact with the positioning member. Thus, the reflecting mirror elements can be successively positioned. The positioning member may be provided at any position including, for example, outer circumferential portions and central portions of the placement plate.

In order to attach the respective reflecting mirror elements onto the placement plate with the magnetic connection, the placement plate may include a magnet. The placement plate itself may be composed of a magnet. Alternatively, a magnet may be embedded in the placement plate. For example, a plurality of recesses may be formed at predetermined intervals in the placement plate, and the magnet may be accommodated in each of the recesses so that the magnet is not exposed to a surface of the placement plate. When the structure, in which the magnet does not appear on the surface of the placement plate as described above, is adopted, a member, which has a high flatness, can be used as the placement plate to obtain more uniform height positions of the reflecting surfaces of the reflecting mirror elements to be arranged thereon. Further, this structure makes it possible to avoid the decrease in magnetic connection (decrease in coercive force of the magnet) which would be otherwise caused by the thermal conduction or the light irradiation when the high energy light beam having the short wavelength is radiated onto the multifaceted reflecting mirror.

Each of the reflecting mirror elements may include a permanent magnet such as those composed of neodymium, samarium, cobalt, and ferrite. In this arrangement, in order to avoid any positional deviation caused by the repulsion between the adjoining reflecting mirror elements, the reflecting mirror elements may be arranged on the placement plate so that polarities of the adjoining reflecting mirror elements are opposite to one another.

When each of the reflecting mirror elements is formed of a conductor such as invar and silicon, the machining is advantageously performed, because the reflecting mirror element can be cut out to have a desired shape such as a circular arc and a rectangle with the electric discharge machining. In order to form the reflecting surface of the reflecting mirror element, a metal plating may be applied to the surface. When the reflecting mirror element is composed of silicon, it is enough to perform the surface polishing in order to form the reflecting surface. As for the plurality of reflecting mirror elements, all of them may have an identical three-dimensional shape (curved shape) of the reflecting mirrors, or they may include a plurality of different three-dimensional shapes. When the plurality of different three-dimensional shapes are included, they may be arranged on the placement plate in accordance with predetermined repeating cycles. The contour shape of the reflecting mirror may be arbitrary, and it may be, for example, circular arc-shaped or rectangular.

According to a second aspect of the present invention, there is provided an illumination optical system comprising:

a first multifaceted reflecting mirror which comprises a plurality of reflecting mirror elements having reflecting surfaces, the plurality of reflecting mirror elements being disposed adjacently on a first placement plate; and a second multifaceted reflecting mirror which comprises a plurality of reflecting mirror elements having reflecting surfaces, the plurality of reflecting mirror elements being disposed adjacently on a second placement plate, wherein:

the respective reflecting mirror elements of the first multifaceted reflecting mirror are fixed on the first placement plate with magnetic force.

The illumination optical system of the present invention has the advantages as described above, because it is provided with the multifaceted reflecting mirror according to the present invention. Therefore, the illumination optical system of the present invention is extremely preferably used in vacuum or in an inert gas atmosphere in which the uniform illumination is required and the light beam having the short wavelength of not more than 200 nm is radiated. In the illumination optical system of the present invention, the respective reflecting mirror elements of the second multifaceted reflecting mirror may be fixed on the second placement plate with magnetic force. The reflected light beams, which come from the reflecting surfaces of the reflecting mirror elements of the first multifaceted reflecting mirror, travel toward the reflecting surfaces of the reflecting mirror elements of the second multifaceted reflecting mirror corresponding to the reflecting mirror elements of the first multifaceted reflecting mirror respectively. The illumination optical system of the present invention may include a focusing lens or a reflecting mirror which converges the light beam reflected by each of the reflecting mirror elements of the first or second multifaceted reflecting mirror.

According to a third aspect of the present invention, there is provided an exposure apparatus comprising the illumination optical system according to the present invention. The mask can be illuminated with a uniform light beam, and the substrate (wafer) can be exposed at a uniform exposure intensity, because the illumination optical system uses the multifaceted reflecting mirror of the present invention. The present invention is especially preferably applicable a reflection type exposure apparatus in which the light source having the short wavelength of not more than 200 nm such as the soft X-ray is used, because no adhesive is used in the multifaceted reflecting mirror. In order to use the light source having the short wavelength as described above, it is desirable that the exposure apparatus is accommodated in a chamber in which the interior is maintained in vacuum. The exposure apparatus may further comprise a reflection type projection optical system which projects, onto the substrate, an image of the mask pattern illuminated by the illumination optical system. In order to enhance the efficiency of use of light, the reflecting surface of the reflecting mirror element of the first multifaceted reflecting mirror has a shape which is similar to a shape of an optical field of the reflection type projection optical system. For example, the reflecting surface may be circular arc-shaped.

According to a fourth aspect of the present invention, there is provided a method for producing the multifaceted reflecting mirror of the present invention, comprising:

forming a reflecting surface on a conductor plate;

cutting out a plurality of reflecting mirror elements from the conductor plate with electric discharge machining; and arranging the reflecting mirror elements on a placement plate which is joined to the reflecting mirror elements with magnetic force so that the reflecting mirror elements are arranged mutually adjacently in accordance with a predetermined pattern. The positions of the reflecting mirror elements can be adjusted extremely easily on the placement plate, because the reflecting mirror elements are joined onto the placement plate with the magnetic force in the production method of the present invention. The method is also excellent in view of the environment, because no adhesive is used. The production method may further comprise pushing at least one of the reflecting mirror elements against a positioning member provided on the placement plate to position the reflecting mirror element on the placement plate, in order to position the reflecting mirror element easier.

DESCRIPTION OF THE PREFERRED EMBODIMENTS OF THE INVENTION

An explanation will be specifically made below with reference to the drawings about the method for producing the reflecting mirror elements and the illuminating apparatus based on the use of the reflecting mirror elements according to the present invention. However, the present invention is not limited thereto.

First Embodiment

Figure 1:
FIGS. 1(a) to 1(c) show steps of manufacturing reflecting mirror elements in a first embodiment of the present invention.
Figure 1:
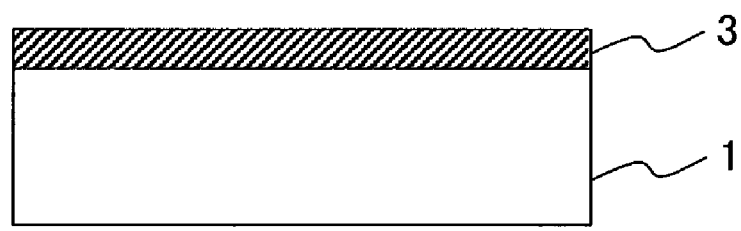
Figure 1:
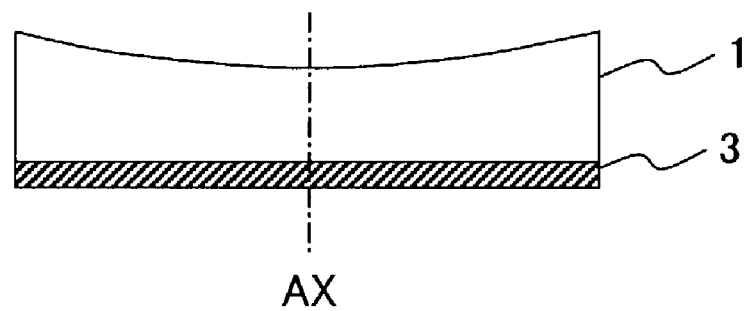

At first, as shown in FIG. 1(a), a disk-shaped metal plate (conductor plate) 1, which was composed of an aluminum alloy having a diameter of 150 mm and a thickness of 15 mm, was formed. One surface of the metal plate 1 was polished to be flat so that the flatness was about several to several tens of $\mu$m. A nickel film 3 was formed to have a thickness of about several tens of $\mu$m to several mm on the flat surface with the electroless plating method (FIG. 1(b)). Subsequently, the plated surface 3 was ground or cut by using a grinding machining machine or a cutting machining machine (not shown), and thus the plating thickness was made uniform. Subsequently, the surface, which was disposed on the side opposite to the surface having the nickel film 3 formed thereon, was machined to be a concave surface having a radius of curvature of 1800 mm by using a lathe (not shown) so that the thickness is thinnest at the central axis AX of the metal plate 1 (FIG. 1(c)). At this stage, the thickness of the metal plate 1 at the central axis AX was 9.95 mm.

Figure 2:
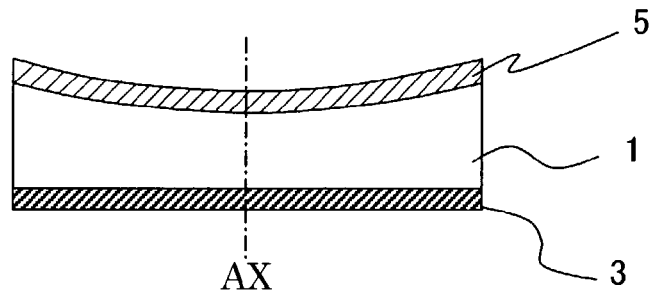
FIGS. 2(a) to 2(c) show steps of manufacturing the reflecting mirror elements in the first embodiment.
Figure 2:
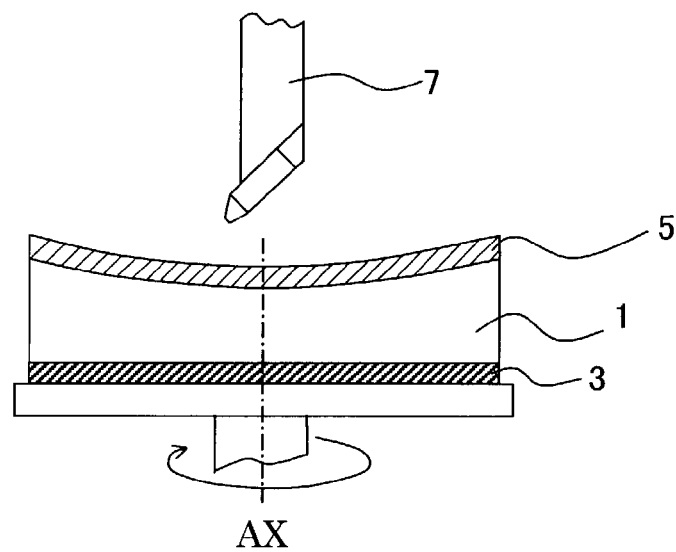
Figure 2:
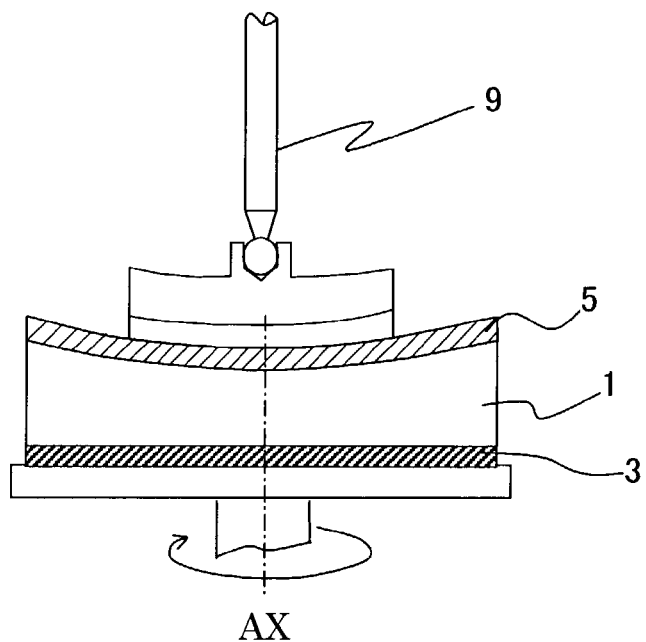

Further, a nickel film 5 having a thickness of 100 $\mu$m was formed on the concave surface with the electroless plating method (FIG. 2(a)). Further, the nickel film 5 was subjected to cutting in an amount of 50 $\mu$m by using an NC cutting machine 7 provided with a diamond turning tool (FIG. 2(b)). Accordingly, the thickness was 10 mm at the central axis AX of the reflecting mirror element. The surface roughness of the nickel film 5 after the cutting was not more than 1 $\mu$m.

Figure 3:
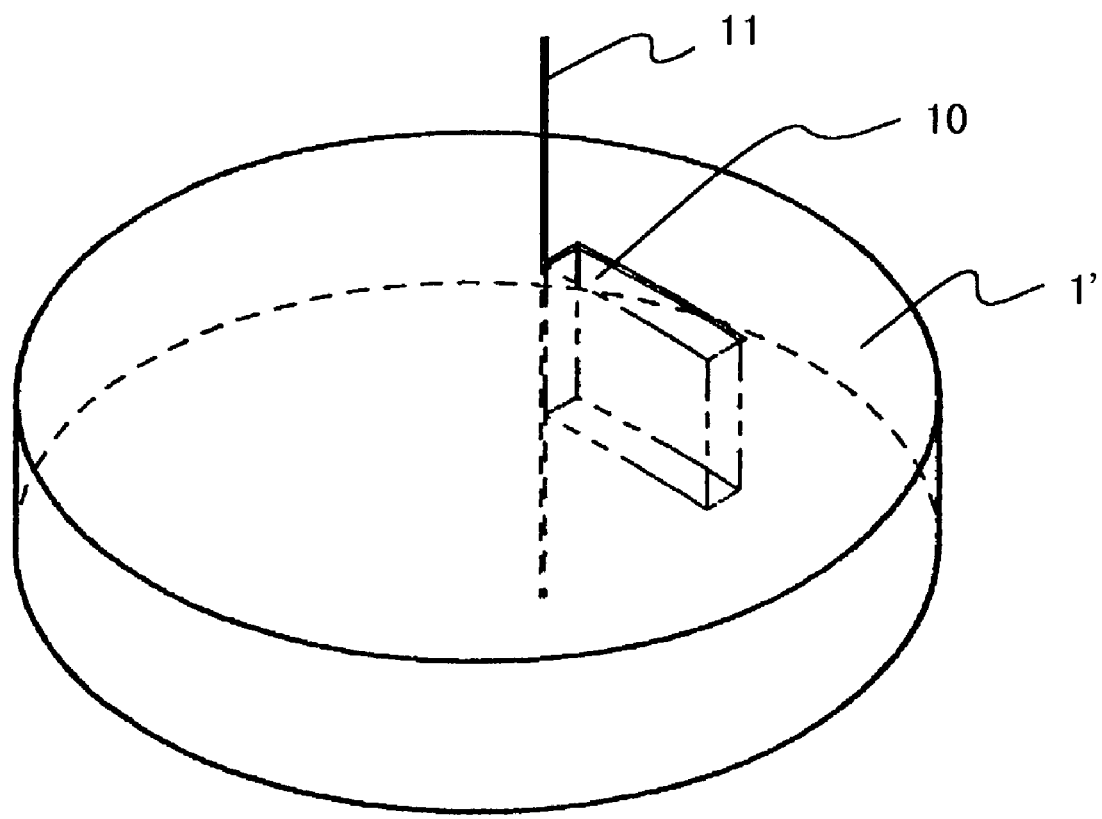
FIG. 3 schematically shows a situation in which the reflecting mirror element is cut out from a disk-shaped metal plate in the first embodiment.
Figure 4:
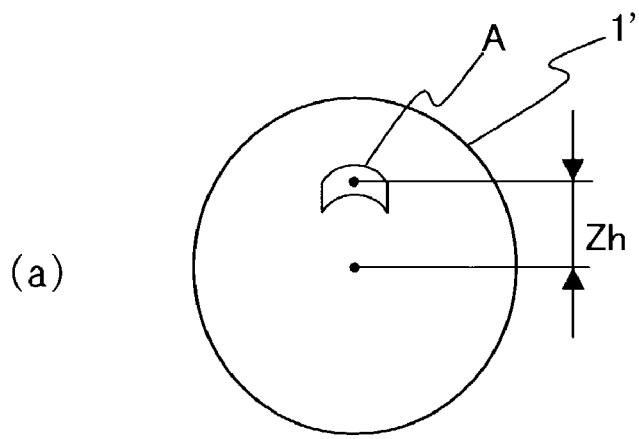
FIGS. 4(a) to 4(c) schematically show positions at which the reflecting mirror elements are cut out from the disk-shaped metal plate in the first embodiment.
Figure 4:
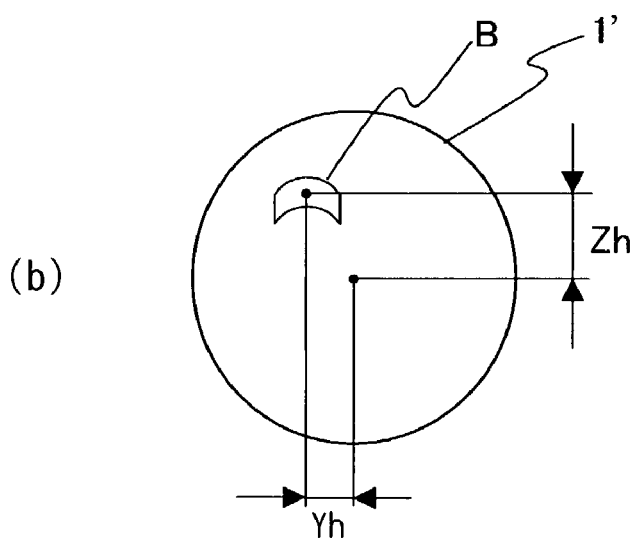
Figure 4:
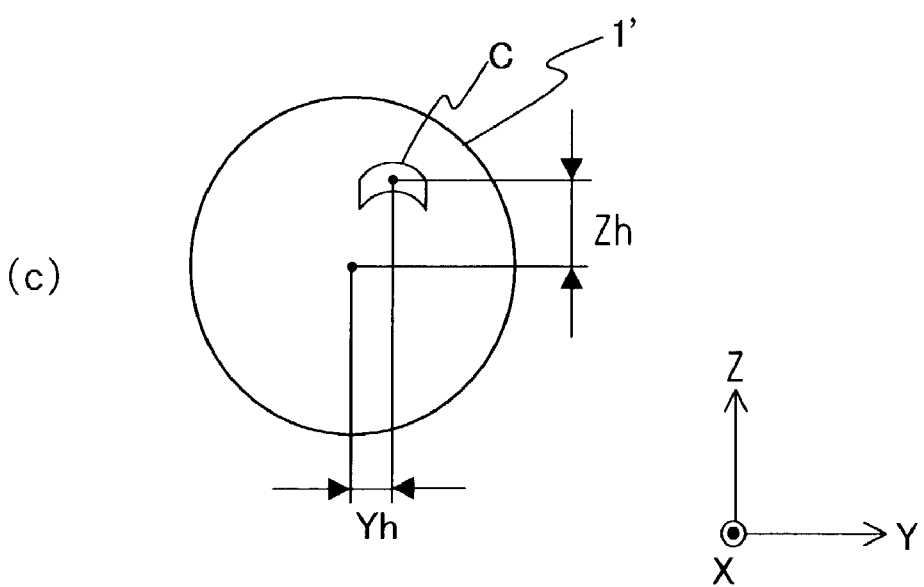

Subsequently, as shown in FIG. 2(c), the nickel film 5, which was disposed on the disk-shaped metal plate 1, was polished by using an Oscar polishing machine 9. The polishing was performed so that the surface roughness Rrms<0.3 nm was satisfied while maintaining the radius of curvature 1800 mm. A portion of a disk-shaped metal plate 1' obtained as described above, which was disposed at a predetermined position, was cut out by using an electric discharge wire 11 of a wire electric discharge machining machine as shown in FIG. 3 so that the flat surface, which was perpendicular to the axis AX, had a circular arc-shaped configuration. Accordingly, a reflecting mirror element 10 was obtained, in which the length was 15.0 mm, the width was 1.0 mm, and the radii of curvature of the convex surface and the concave surface were 20 mm respectively. In this embodiment, when the circular arc-shaped reflecting mirror elements were cut out from the metal plate 1', they were cut out with three different patterns of A, B, C as shown in FIGS. 4(a), 4(b), and 4(c) respectively. That is, in FIG. 4(a), the center of the circular arc-shaped plane pattern A is positioned while being deviated by +Zh in the Z direction from the center AX of the metal plate 1'. In FIG. 4(b), the center of the circular arc-shaped plane pattern B is positioned while being deviated by +Zh in the Z direction and -Yh in the Y direction from the center AX of the metal plate 1'. In FIG. 4(c), the center of the circular arc-shaped plane pattern is positioned while being deviated by +Zh in the Z direction and +Yh in the Y direction from the center AX of the metal plate 1'. In this embodiment, Zh=5.0 mm and Yh=7.5 mm were given. The reflecting mirror elements, which were cut out in accordance with the respective patterns (positions) of A, B, C, were mutually different from each other in the curved surface shape of the upper surface respectively.

Figure 5:
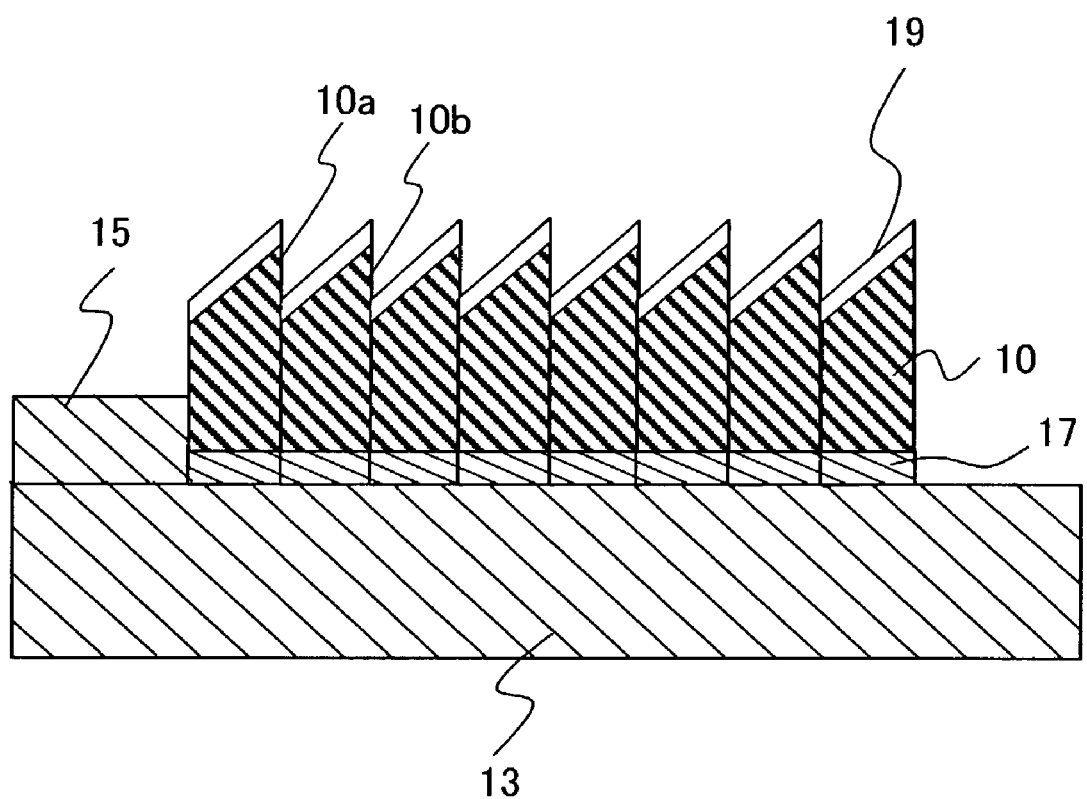
FIG. 5 shows a schematic plan view illustrating a multifaceted reflecting mirror manufactured in the first embodiment.
Figure 6:
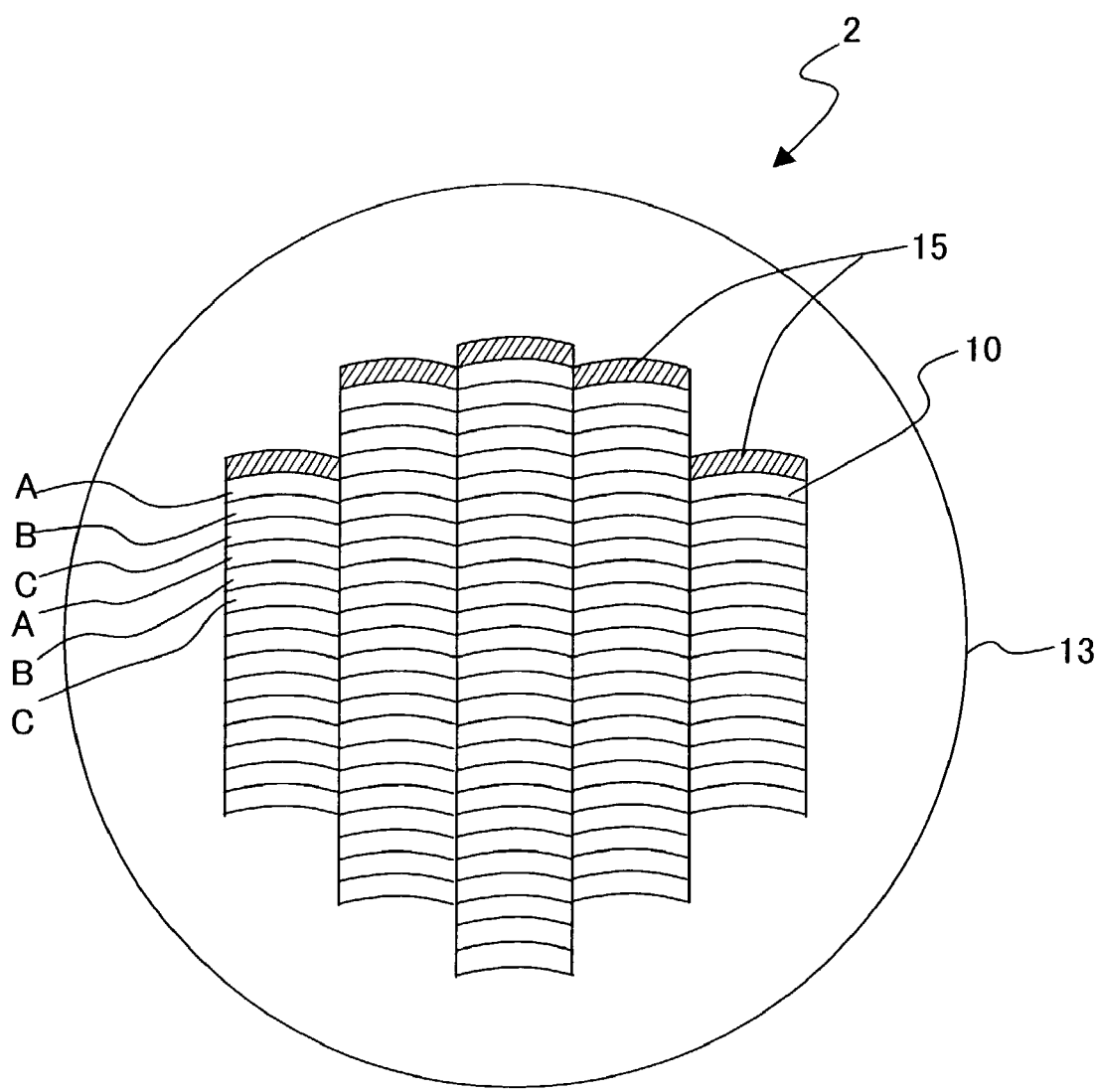
FIG. 6 shows a schematic top view illustrating the multifaceted reflecting mirror manufactured in the first embodiment.

The cut out reflecting mirror elements 10 are arranged in a predetermined order on a base-plate 13 as shown in FIG. 5. The base plate 13 is composed of a neodymium magnet having a diameter of 100 mm, a height of 10 mm, and a flatness (surface roughness) of 5 $\mu$m. The neodymium magnet sometimes becomes rusty. Therefore, a nickel plating having a thickness of 2 to 3 $\mu$m, which serves as a rust preventive, may be applied to the surface. As appreciated from FIGS. 5 and 6, positioning guides 15, which fasten the reflecting mirror elements, are provided at five places at outer circumferential portions of the base plate 13. The reflecting mirror elements 10 were arranged on the base plate 13 so that the nickel films 17 (portions cut out from the nickel film 3) were magnetically joined to the base plate 13. In this procedure, as shown in FIG. 5, the reflecting mirror element 10a is firstly arranged on the base plate 13 so that the reflecting mirror element 10a is pushed against the guide 15. Accordingly, the reflecting mirror element 10a is positioned on the surface of the base plate 13. Subsequently, the reflecting mirror element 10b is arranged on the base plate 13 so that the reflecting mirror element 10b is pushed against the reflecting mirror element 10a. In this way, the reflecting mirror elements are successively arranged so that they are adjoined to one another. Accordingly, the reflecting mirror elements are positioned on the base plate 13 highly accurately without any gap. The reflecting mirror elements have the three types of the curved surface shapes (corresponding to the patterns A, B, C) which are different from each other as described above. The reflecting mirror elements were arranged, for example, in accordance with an arrangement order as shown in FIG. 6 so that the concave-shaped nickel films 19 (portions cut out from the nickel film 5, hereinafter referred to as "reflecting surfaces") were directed in an identical direction. The reflecting mirror elements 10, which are arranged on the base plate 13, can be also positionally adjusted and arranged highly accurately, because the flatness of the base plate 13 is high. Accordingly, a multifaceted reflecting mirror 2 was obtained as shown in FIG. 6. In this embodiment, in order to avoid the decrease in magnetic field intensity generated from the neodymium magnet, a means for cooling the base plate 13 may be provided.

First Modified Embodiment

Figure 7:
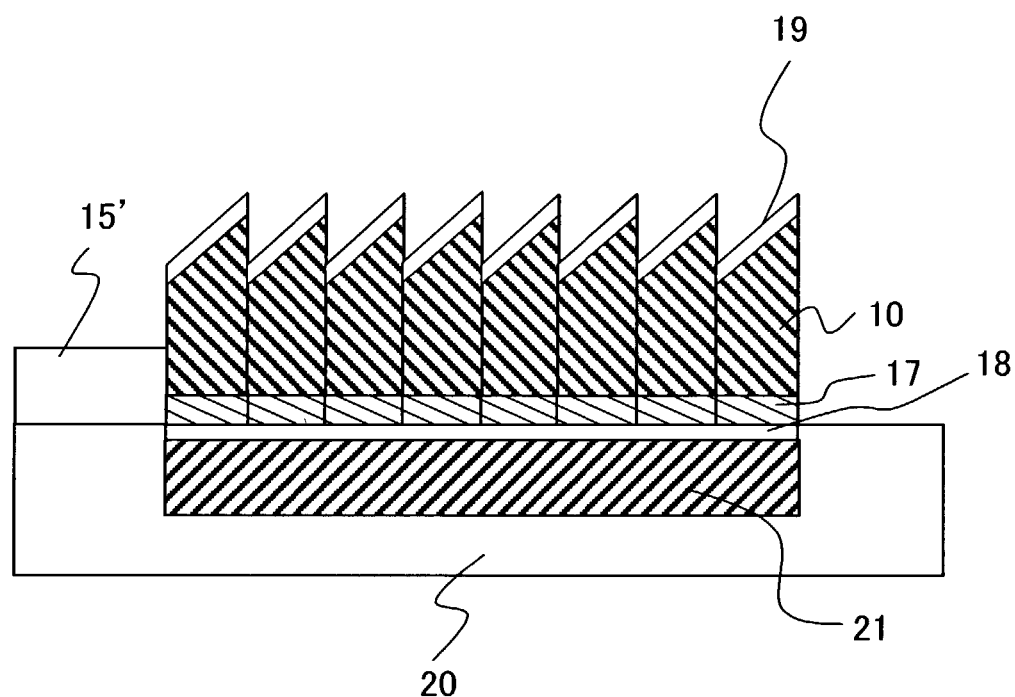
FIG. 7(a) shows a schematic plan view illustrating a multifaceted reflecting mirror in a first modified embodiment of the present invention.
FIG. 7(b) shows a schematic side view illustrating the multifaceted reflecting mirror shown in FIG. 7(a).
Figure 7:
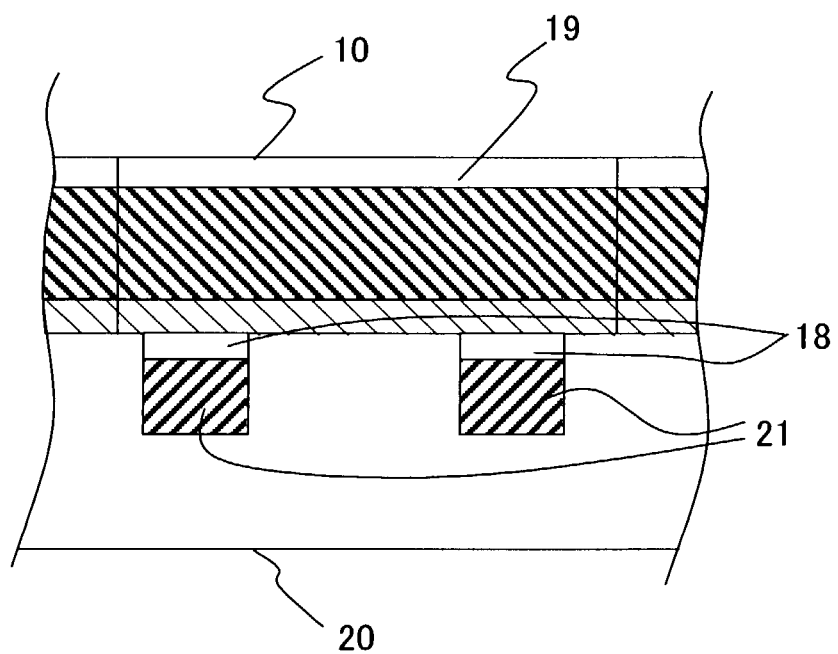

A modified embodiment of the first embodiment will be explained with reference to FIGS. 7(*a*) and 7(*b*). The first modified embodiment was constructed in the same manner as the first embodiment except that a base plate 20 was formed of a non-magnetic metal, recesses 18 each having a rectangular cross section were provided in the base plate 20, and magnets 21 for fixing the reflecting mirror elements 10 were embedded in the recesses 18. As shown in FIGS. 7(*a*) and 7(*b*), the base plate 20 was manufactured with a non-magnetic metal material composed of brass to have the same size as that in the first embodiment. The plurality of recesses 18 are formed in parallel in a predetermined direction on one surface of the base plate 20 by using an NC cutting machine (not shown) so that the cross section is rectangular with a length of 100 mm, a width of 3.0 mm, and a depth of 10 mm. Neodymium magnets 21, each of which had a thickness of 3.0 mm, were embedded in the respective recesses 18. The neodymium magnet sometimes becomes rusty. Therefore, a nickel plating having a thickness of 2 to 3 μm, which serves as a rust preventive, may be applied to the surface. The depth ranging from the base plate surface to the magnet 21 was 0.5 mm. Subsequently, the reflecting mirror element 10 was arranged on the base plate 20 so that the reflecting mirror element 10 rode over the two recesses 18. The surface of the base plate 20 is made of the non-magnetic metal. Therefore, the flatness is high and the surface roughness is small, as compared with a case of formation with a magnetic member as a sintered body. Accordingly, the respective reflecting mirror elements 10 can be installed on the base plate 20 highly accurately especially in relation to the position in the height direction. That is, it is possible to enhance the uniformity of the position in the height direction of the reflecting surface of the multifaceted reflecting mirror. Further, the magnets 21 are not exposed to the surface of the base plate 20, and no contact is made between the magnets 21 and the reflecting mirror elements 10. Therefore, even when the reflecting mirror elements 10 are heated by being irradiated with the light, the magnets are prevented from direct heat transfer from the reflecting mirror elements 10. Therefore, it is possible for the magnets 21 to maintain the magnetization (magnetic field) for supporting the reflecting mirror elements 10 on the base plate 20. Further, even when the flatness is lowered by the nickel plating applied to the magnets, the arrangement accuracy of the reflecting mirror elements 10 is not affected, because no contact is made between the magnets 21 and the reflecting mirror elements 10. The size of the magnet to be used in this modified embodiment is smaller than the size of the magnet to be used in the first embodiment. Therefore, it is easy to perform the manufacturing process.

Second Modified Embodiment

Figure 8:
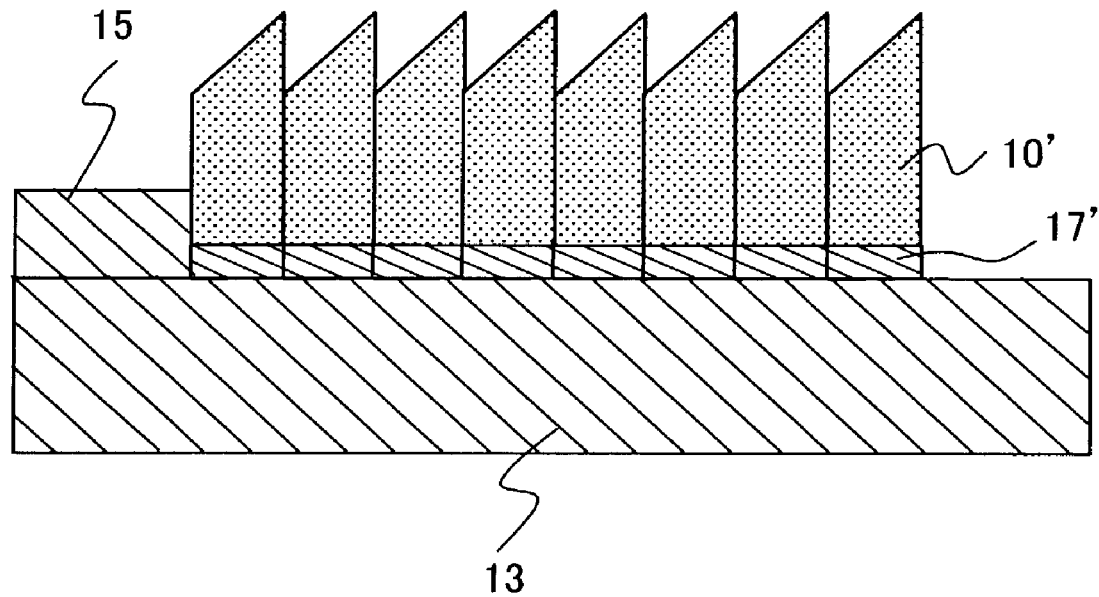
FIG. 8 shows a schematic plan view illustrating a multifaceted reflecting mirror in a second modified embodiment of the present invention.

Another modified embodiment of the first embodiment will be explained with reference to FIG. 8. Reflecting mirror elements 10' were constructed in the same manner as in the first embodiment except that silicon was used in place of the aluminum alloy as the material for the metal plate 1 and the nickel film 5 based on the electroless plating was not formed. One having a low resistance value (resistance value: 0.02 Ωm) was used as silicon. In this embodiment, the surface of the reflecting mirror element 10' can be made into a mirror surface by polishing the surface of silicon by using an Oscar polishing machine. Therefore, it is unnecessary to perform the electroless plating step which would be otherwise performed in order to form the reflecting surface of the reflecting mirror element. It is possible to simplify the production steps for the reflecting mirror element.

Second Embodiment

Figure 9:
FIGS. 9(a) and 9(b) schematically show magnets in a second embodiment.
FIGS. 9(c) and 9(d) show the magnets arranged so that polarities of the adjacent magnets are alternate to one another.
Figure 9:
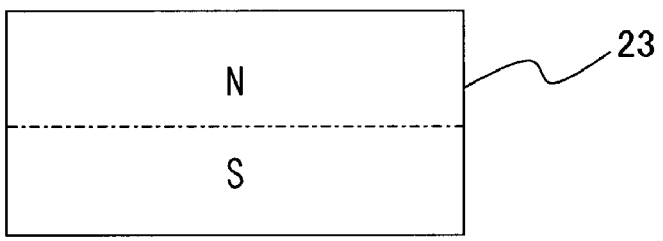
Figure 9:
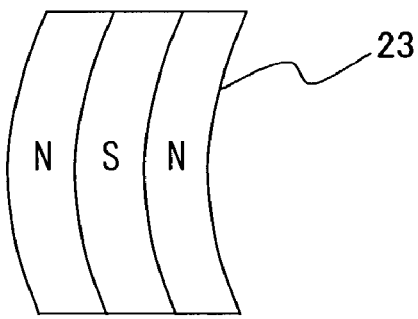
Figure 9:
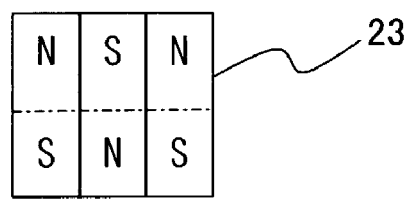
Figure 10:
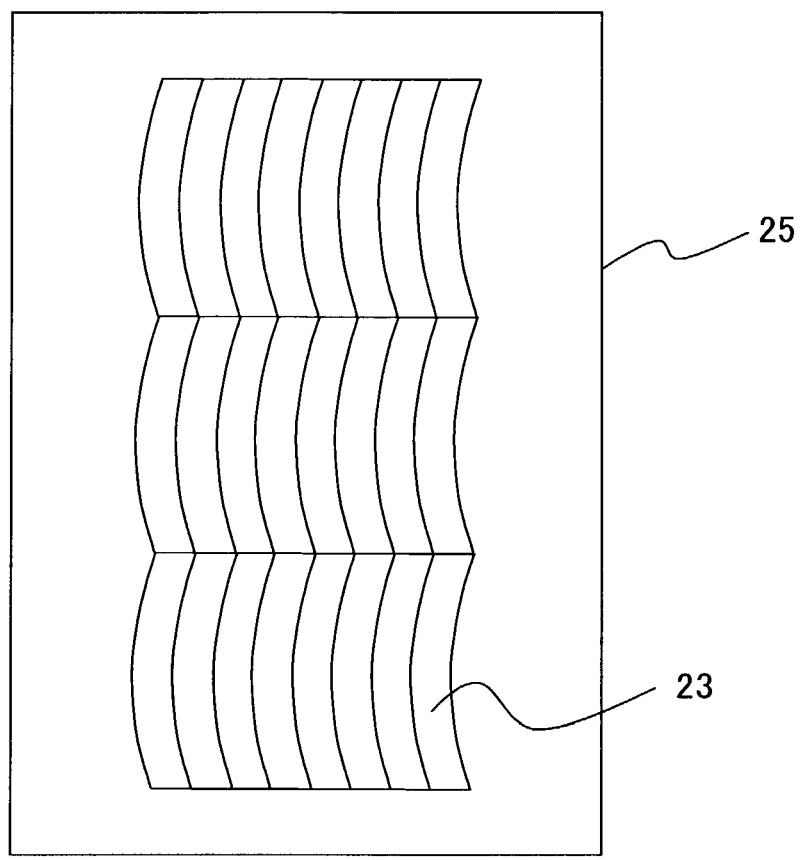
FIGS. 10(a) and 10(b) show the magnets shown in FIG. 9 arranged on a surface plate.
Figure 10:
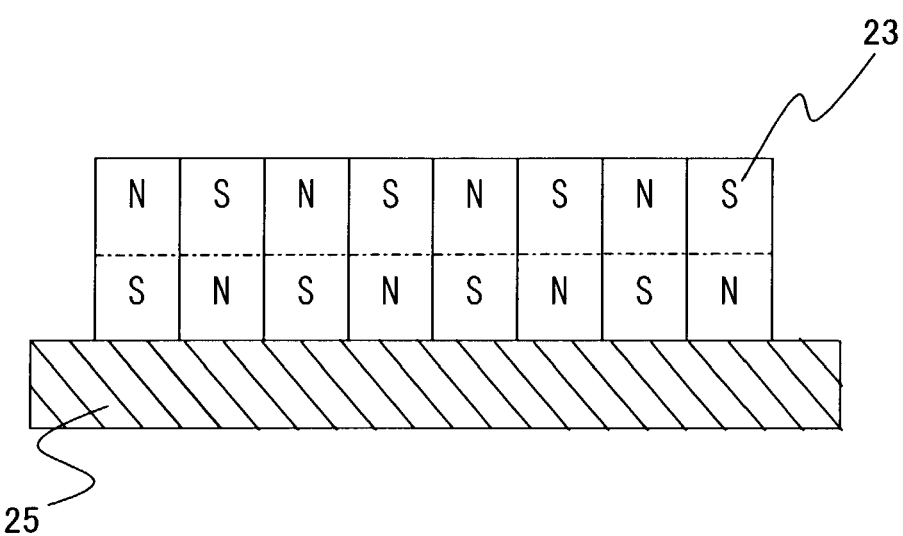
Figure 11:
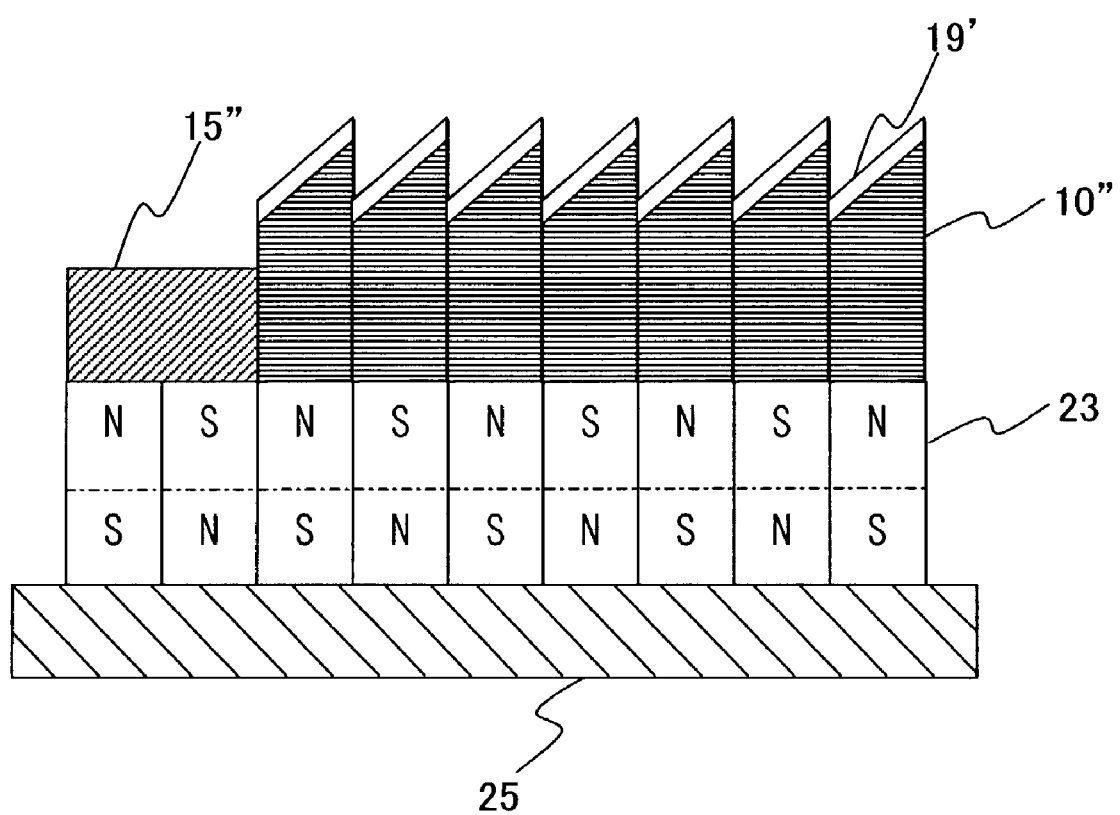
FIG. 11 shows a schematic plan view illustrating a multifaceted reflecting mirror manufactured in the second embodiment.

A process for producing a multifaceted reflecting mirror according to a second embodiment of the present invention will be explained with reference to FIGS. 9, 10, and 11. Reflecting mirror elements in the second embodiment were basically constructed in the same manner as in the first embodiment except that invar was used as a material for a metal plate 1. However, if the plurality of reflecting mirror elements are arranged on a base plate composed of magnet, the adjoining reflecting mirror elements are magnetized to have an identical polarity, because the side of the reflecting mirror element, which is disposed on the contact surface (bottom surface) with respect to the base plate, is magnetized to have a magnetic pole opposite to that of the base plate. Therefore, the adjoining reflecting mirror elements are consequently repelled to one another. In the first embodiment, the repulsive force between the adjoining reflecting mirror elements is small, because the nickel film 17 as the magnetic material is a thin film. However, in this embodiment, the repulsive force is relatively large, because the reflecting mirror element itself is composed of invar which is a magnetic material. Therefore, the repulsive force makes it impossible to arrange the plurality of reflecting mirror elements in accordance with a predetermined pattern on the base plate while effecting tight contact with each other. Accordingly, as explained below, magnets are installed between the base plate and the reflecting mirror elements respectively. As shown in FIGS. 9(*a*) and 9(*b*), neodymium magnets 23, each of which had a circular arc-shaped cross section in the same manner as the cut out shape of the reflecting mirror element, were manufactured. Subsequently, as shown in FIGS. 9(*c*) and 9(*d*), the magnets 23 were bonded to one another so that the magnetic poles were disposed alternately beforehand. As shown in FIGS. 10(*a*) and 10(*b*), a group of bonded magnets 23 were installed on a surface plate 25 composed of nickel. Subsequently, as shown in FIG. 11, the reflecting mirror elements 10" were successively arranged so that one reflecting mirror element 10" was positioned on each of the plurality of arranged magnets 23. In this procedure, guides 15" are provided on the surface plate. Therefore, the reflecting mirror elements 10" can be successively arranged on the basis of the guides

15". The respective reflecting mirror elements 10" made of invar are magnetically jointed to the magnets 23 on which they are seated. However, the adjoining magnets 23 have the mutually opposite polarities, and hence the adjoining reflecting mirror elements 10" are mutually magnetized so that the opposite polarities are formed as well. Therefore, the adjoining reflecting mirror elements 10" are not repelled to one another, and they make tight contact in accordance with the opposite polarities. Thus, their positions are reliably fixed.

Third Embodiment

Figure 12:
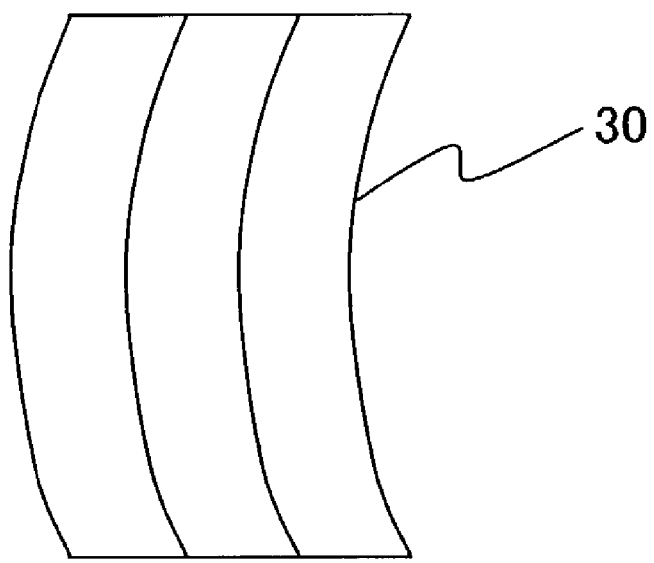
FIGS. 12(a) and 12(b) schematically show reflecting mirror elements manufactured in a third embodiment.
Figure 12:
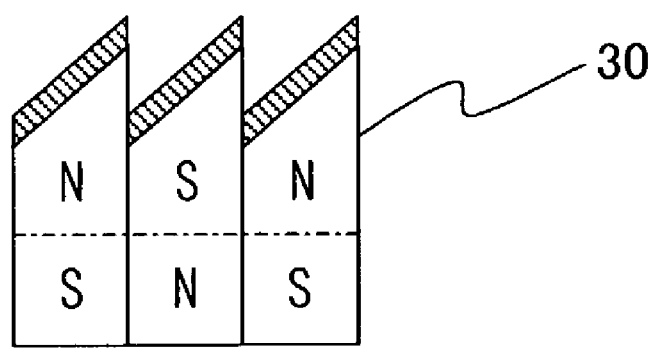
Figure 13:
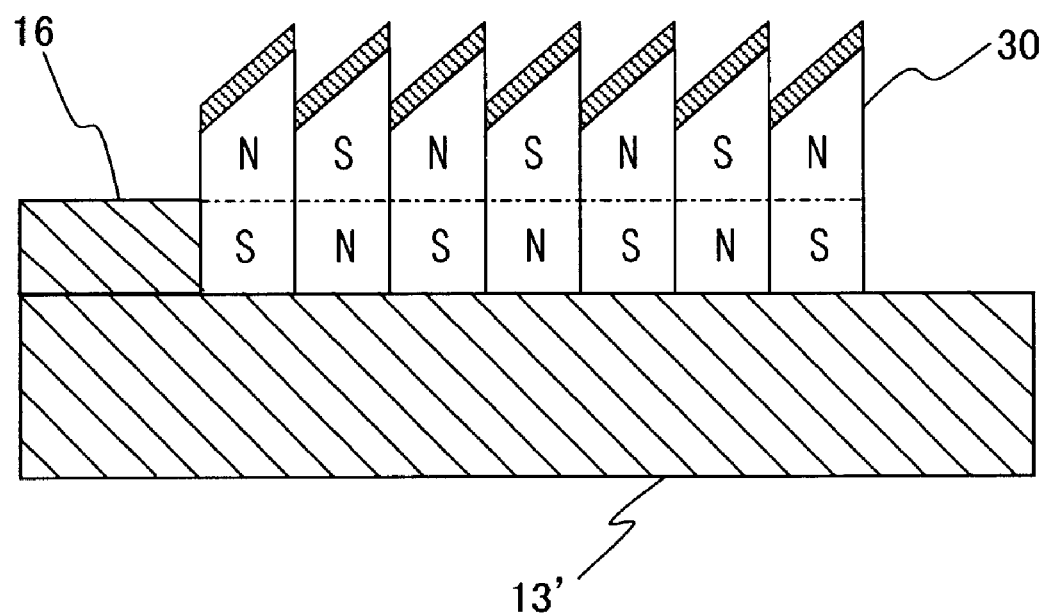
FIG. 13 shows a schematic plan view illustrating a multifaceted reflecting mirror manufactured in the third embodiment.

A third embodiment of the present invention will be explained with reference to FIGS. 12 and 13. In this embodiment, a multifaceted reflecting mirror was constructed in the same manner as in the first embodiment except that reflecting mirror elements were formed of magnet, and a base plate made of metal was used. Ferrite was used as a metal plate 1 from which the reflecting mirror elements were cut out. The reflecting mirror elements 30 were cut out by using a wire electric discharge machining machine from the disk-shaped metal plate 1 made of ferrite in the same manner as in the first embodiment. The respective reflecting mirror elements 30 were magnetized by using an electromagnet. In this procedure, the reflecting mirror elements 30 were magnetized so that the adjoining reflecting mirror elements 30 had mutually different polarities on the reflecting surface side and on the seating surface side respectively as shown in FIG. 12(*b*). The magnetized reflecting mirror elements 30 were bonded to one another with the magnetic force as shown in FIGS. 12(*a*) and 12(*b*). Subsequently, as shown in FIG. 13, a group of reflecting mirror elements 30, which had been bonded to one another with the magnetic force, were adhered onto a base plate 13' composed of nickel. In this procedure, the reflecting mirror elements 30 were positionally adjusted by using guides 16 provided on the base plate 13' in the same manner as in the first embodiment. Accordingly, it is possible to obtain the multifaceted reflecting mirror having been positionally adjusted highly accurately.

In the third embodiment, the respective reflecting mirror elements were magnetized after being cut out from the metal plate 1. However, the following procedure may be adopted. That is, metal plates 1 made of ferrite are previously prepared, and they are magnetized so that different magnetic poles appear mutually on reflecting surface sides. Reflecting mirror elements, which are cut out from each of the metal plates 1, are combined and arranged on the base plate. Further, the multifaceted reflecting mirror as described above may be installed with a cooling unit for cooling the reflecting mirror elements in order to avoid the decrease in coercive force of the magnet which would be otherwise caused by the heat generated in the reflecting mirror elements by being irradiated with the light. Especially, when the light beam having a short wavelength such as the soft X-ray is used as the illumination light beam, the multifaceted reflecting mirror is installed in vacuum. Therefore, a contact type cooling unit such as a Peltier element may be provided on the back surface of the multifaceted reflecting mirror, i.e., on the side of the base plate. A flow passage may be provided in the base plate, and cooling water may be allowed to flow through the flow passage to cool the reflecting mirror elements.

In the first embodiment, the aluminum alloy was used as the material for the reflecting mirror element. Alternatively, steel lumber, oxygen-free copper, or super invar may be used. As for the material for the reflecting mirror element, the electric discharge machining can be performed when a conductive material is used, and hence it is easy to cut out the reflecting mirror element having a desired shape from a metal plate. In the second embodiment described above, the electroless nickel plating was applied to invar. However, for example, a thin film having high reflectivity such as those of nickel alloy may be formed in place of the electroless nickel plating, provided that the mirror surface performance is satisfactory after the cutting and the polishing. Alternatively, it is also possible to use glass as another material for the reflecting mirror element. In this case, it is possible to obtain a desired surface roughness in the same manner as in silicon even when the electroless nickel plating is not applied. Those usable as the glass include, for example, quartz glass and low expansion glass. When the glass is machined, the cutting machining can be performed in place of the wire electric discharge machining in order to cut out the glass piece from the substrate.

In the embodiments described above, the wire electric discharge machining machine was used to cut out the reflecting mirror element. Alternatively, the reflecting mirror element may be cut out with the milling. The permanent magnet was used as the magnet for constructing the base plate. Alternatively, an electromagnet may be embedded in the base plate, or it may be attached to the base plate. The reflecting mirror elements, which were cut from the disk-shaped metal plate, had three types of patterns, i.e., patterns A, B, C. However, there is no special limitation to the three type. The number of patterns may be either larger than three or smaller than three. Further, all of the reflecting mirror elements may have an identical reflecting surface shape, or the reflecting mirror elements may have different reflecting surface shapes. The reflecting mirror element may be obtained by cutting off a part of an aspheric surface. The reflecting mirror elements having different shapes may be arranged in accordance with a predetermined repeating arrangement, or they may be arranged in other ways. The size of the multifaceted reflecting mirror and the size of the reflecting mirror element are not limited to those described in the embodiments of the present invention as well. Further, the total number of basic reflecting mirrors is not limited to those described in the embodiments of the present invention as well. The sizes and the number as described above may be arbitrarily changed depending on the optical design of the multifaceted reflecting mirror.

Especially, when a short wavelength laser such as an $F_2$ laser is used for a light source for the multifaceted reflecting mirror of each of embodiments described above, the following procedure may be adopted. That is, an aluminum thin film may be formed to have a thickness of about 100 nm with the vapor deposition on the reflecting surface of the reflecting mirror element in order to improve the reflectance, and a film of $MgF_2$ may be formed to have a thickness of several tens of nm with the vapor deposition thereon in order to prevent the oxidation and maintain the reflectance. When a light beam (electromagnetic wave) in the soft X-ray region is used for a light source, it is also preferable to provide, on the reflecting surface, an alternate multilayered film comprising 40 to 50 layers of laminated two-layered films each having a thickness of 7 nm and composed of Si (4.6 nm) and Mo (2.4 nm).

Figure 14:
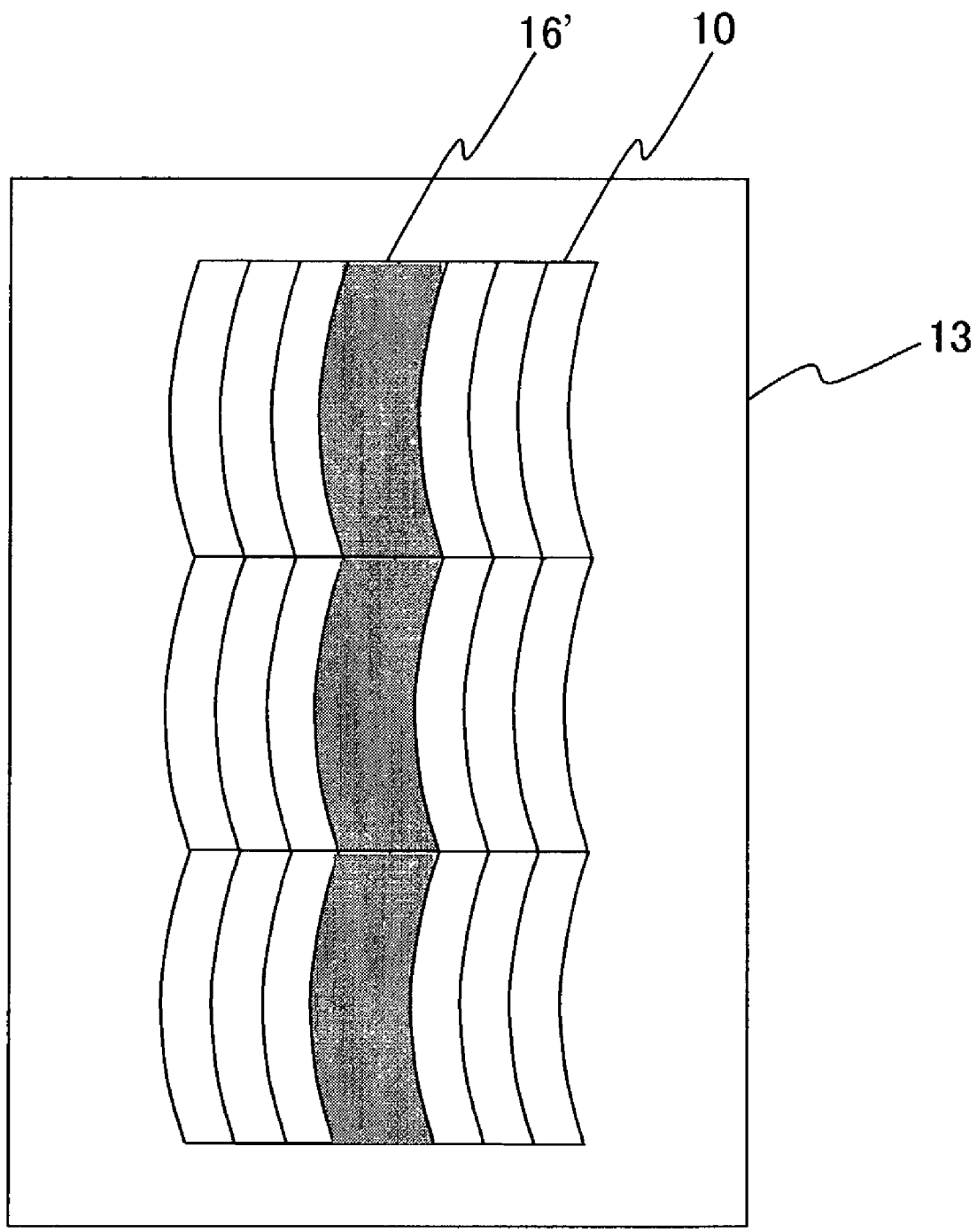
FIG. 14 shows an example of installation of positioning guides for the multifaceted reflecting mirror according to the present invention.

In the embodiments described above, the positioning guides were provided at the outer circumferential portions or the edge portions of the base plate. However, in addition to such positioning guides or in place of such positioning guides, positioning guides 16' may be provided in the arrays of the reflecting mirror elements 10 at constant intervals as shown in FIG. 14. Accordingly, it is possible to perform the positional adjustment of the reflecting mirror elements with a higher degree of accuracy.

Fourth Embodiment

An illumination system, which is based on the use of the multifaceted reflecting mirror provided with the circular arc-shaped reflecting mirror elements manufactured in the embodiment described above, will be explained with reference to FIGS. 15 and 16.

Figure 15:
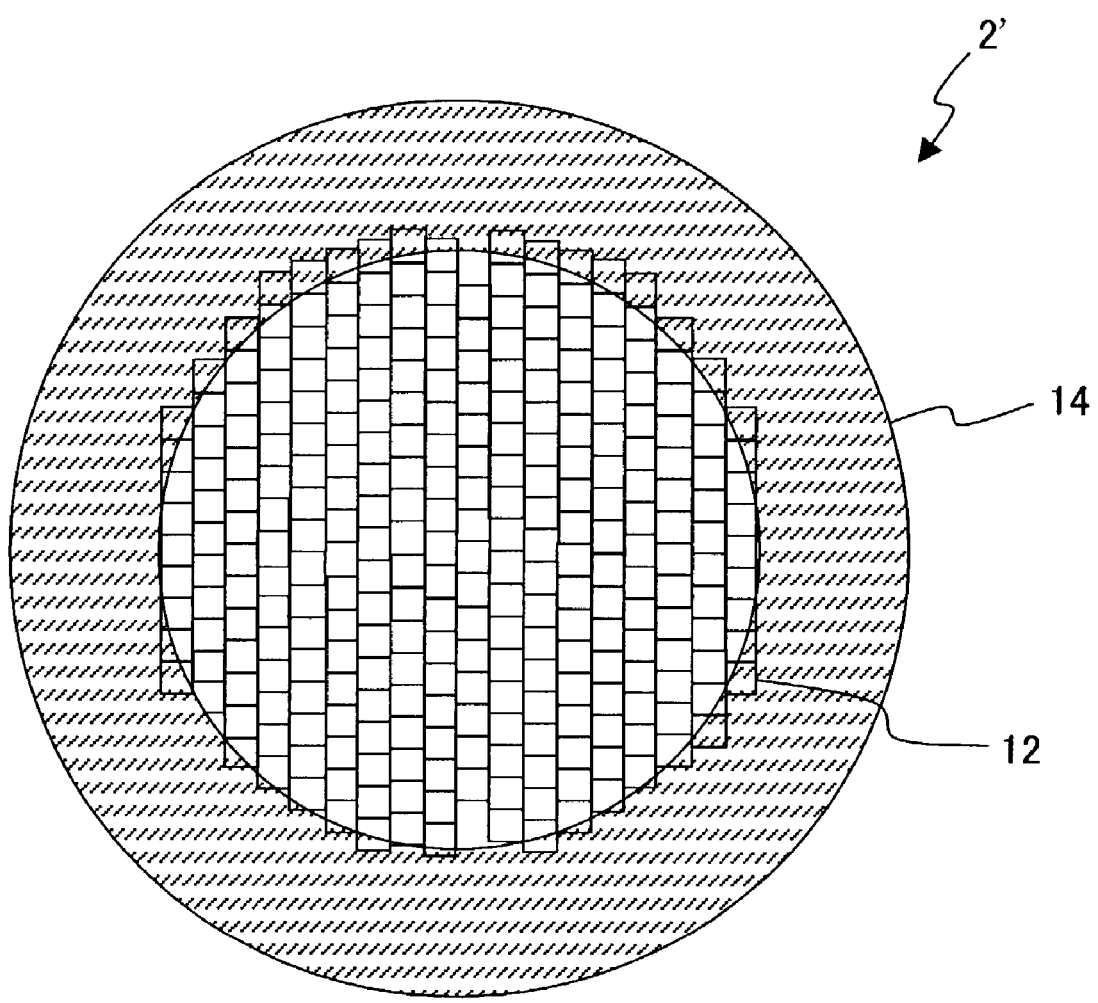
FIG. 15 shows a second multifaceted reflecting mirror manufactured in a fourth embodiment.
Figure 16:
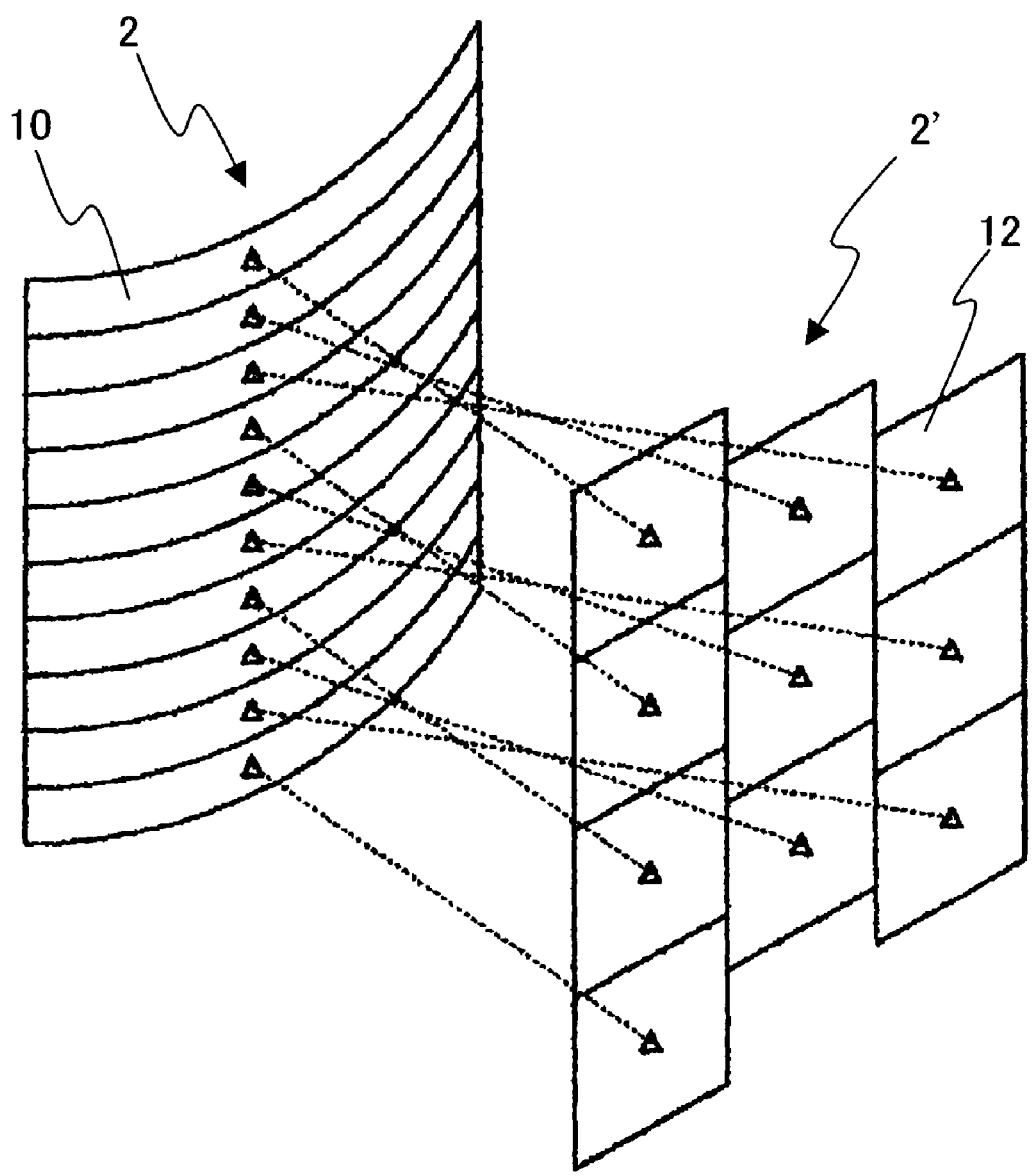
FIG. 16 schematically shows a situation in which the light beams are transmitted from the first multifaceted reflecting mirror to the second multifaceted reflecting mirror in an illumination system produced in the fourth embodiment.

In this embodiment, a first multifaceted reflecting mirror was constructed in the same manner as in the first embodiment except that reflecting mirror elements 10 were cut out from a disk-shaped metal plate having a concave surface of a radius of curvature of 600 mm under a condition in which the length was 15 mm, the width was 1.0 mm, and there were given Zh=50 mm and Yh=7.5 mm. Further, a second multifaceted reflecting mirror was constructed in the same manner as in the first embodiment except that reflecting mirror elements 12 were cut out to have rectangular shapes (shapes of the patterns A, B, C in FIG. 4) from a disk-shaped metal plate having a concave surface of a radius of curvature of 600 mm with the wire electric discharge machining under a condition in which the length was 4.0 mm, the width was 3.0 mm, and there were given Zh=50 mm and Yh=5.0 mm. Accordingly, the first multifaceted reflecting mirror 2 as shown in FIG. 6 and the second multifaceted reflecting mirror 2' as shown in FIG. 15 were obtained. As shown in FIG. 16, the multifaceted reflecting mirrors were combined and arranged at predetermined positions. Accordingly, the light beams, which are reflected by the respective reflecting mirror elements 10 of the first multifaceted reflecting mirror 2, come into the corresponding respective reflecting mirror elements 12 of the second multifaceted reflecting mirror 2'. The reflected light beams from the respective reflecting mirror elements 12 are converged into an identical area by using, for example, a condenser lens. Accordingly, it is possible to generate an illumination area having a uniform illuminance distribution in the area. An illumination light beam in the short wavelength region, which causes the light absorption by the lens, is used for the optical system obtained by combining the multifaceted reflecting mirrors as described above. Such an optical system is useful for various ways of use which require a uniform illuminance distribution in the illumination area. Especially, such an optical system is preferably used for an illuminating apparatus for an exposure apparatus for producing semiconductors and liquid crystal boards by utilizing the light in the soft X-ray region.

Fifth Embodiment

Figure 17:
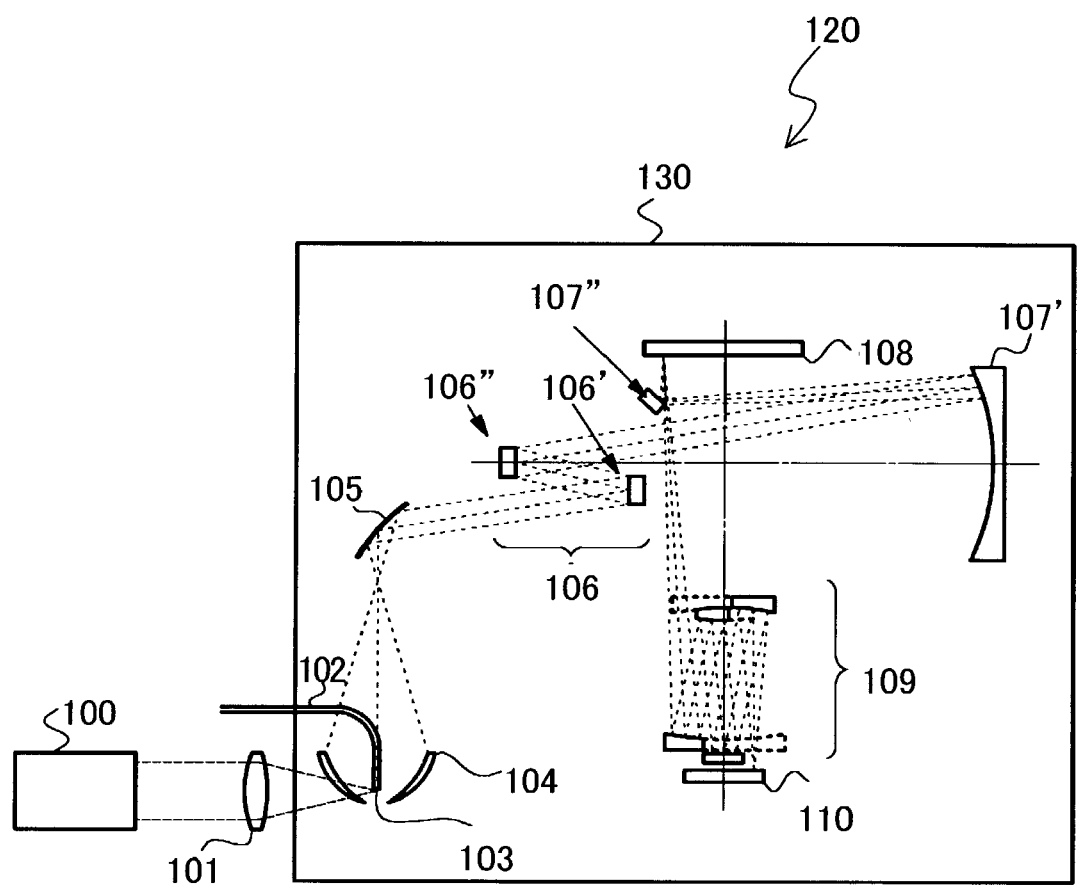
FIG. 17 schematically shows an exposure apparatus in a fifth embodiment.
Figure 18:
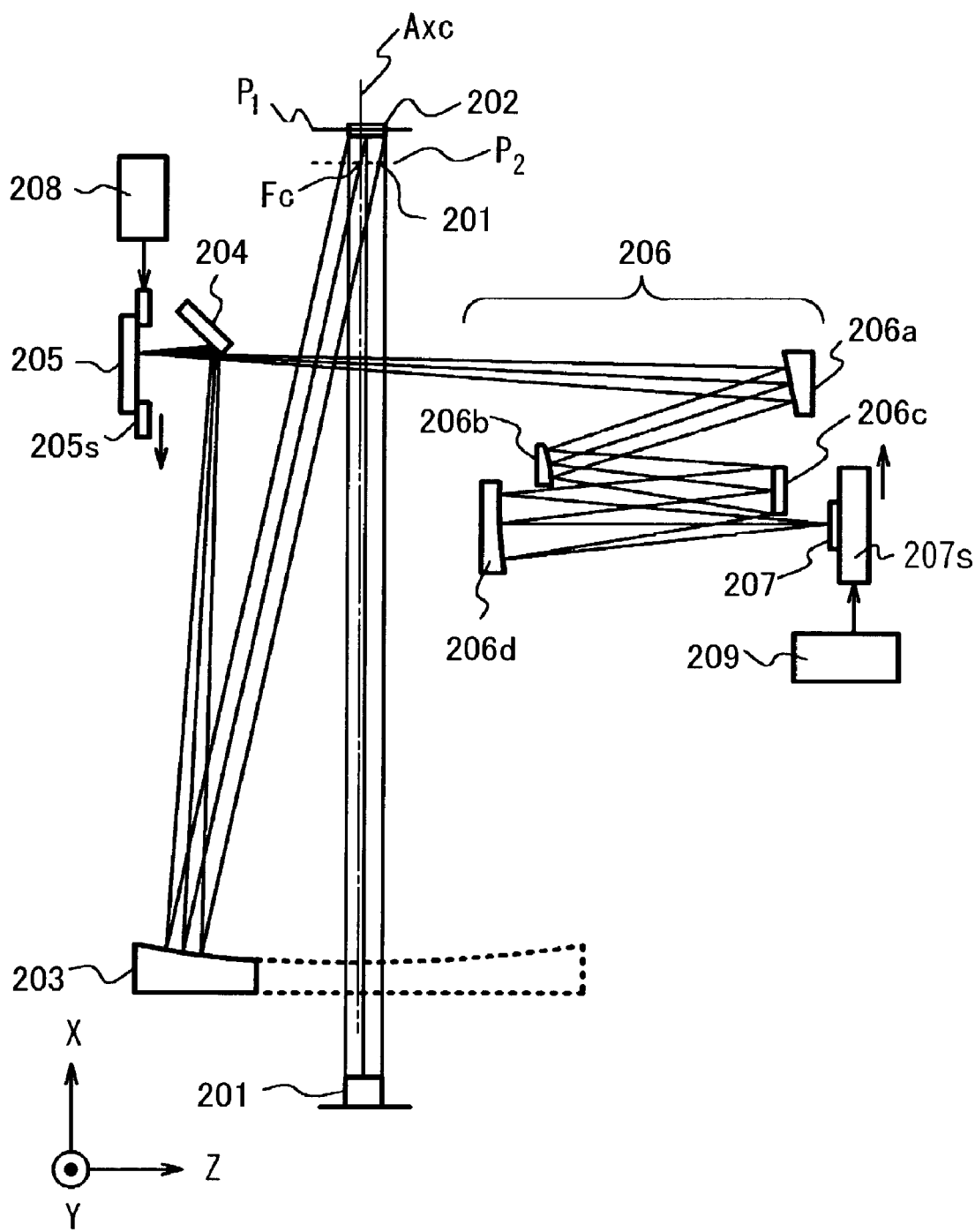
FIG. 18 schematically shows an arrangement of an illumination system to be used for a reflection type projection exposure apparatus.

Next, an exemplary exposure apparatus, which uses the illumination system obtained by combining the first multifaceted reflecting mirror and the second multifaceted reflecting mirror, will be explained with reference to FIG. 17. FIG. 17 shows a schematic view illustrating a projection exposure apparatus 120 according to the present invention. Gas of Xe or liquid of Xe is spouted from a gas nozzle 102. A YAG laser, which is radiated from a laser light source 100, is radiated thereon via a light-collecting lens 101 to generate the plasma. A soft X-ray having a wavelength of 13 nm, which is generated from the formed plasma, comes into a first multifaceted reflecting mirror 106' via a concave reflecting mirror 104 and a collector mirror 105. Alternatively, a substance containing Sn (stannum) may be arranged or spouted at the position of the focusing point 103 of the laser, and the YAG laser may be radiated thereon to generate a soft X-ray. The light beams, which come into respective reflecting mirror elements of the first multifaceted reflecting mirror 106', are reflected by reflecting surfaces of the reflecting mirror elements respectively, and they come into corresponding reflecting mirror elements of a second multifaceted reflecting mirror 106". The light beam, which is reflected by the second multifaceted reflecting mirror 106", passes along a condenser optical element 107' and a reflecting mirror 107", and it radiates only a predetermined area on a mask 108 held on a mask stage (not shown). A circuit pattern to be transferred onto a wafer is previously formed as a reflector pattern on the mask 108 with the photolithography technique. The light beam, which is reflected in accordance with the circuit pattern on the mask 108, is radiated onto the surface of the wafer 110 via a reflection type projection optical apparatus 109. During this process, the mask 108 and the wafer 110 are relatively moved while being synchronized with each other by using the unillustrated mask stage and the unillustrated wafer stage respectively. As a result of this operation, the entire circuit pattern on the mask 108 is scanned with the illumination light beam. Therefore, the entire circuit pattern can be transferred onto the wafer 110. The movement velocities of the mask 108 and the wafer 110 are controlled by controlling the mask stage and the wafer stage by using an unillustrated mask stage controller and an unillustrated wafer stage controller respectively, while the positions of the mask stage and the wafer stage are measured by using laser distance interferometers respectively. Main components of the exposure apparatus 120 are accommodated in a chamber 130 as shown in FIG. 17. The pressure in the chamber 130 is reduced by an unillustrated pressure-reducing unit to give a state of reduced pressure (vacuum) of about $10^{-4}$ to $10^{-7}$ Torr. The reduced pressure atmosphere avoids any decrease in illuminance of the illumination light beam at the mask position and the wafer position, which would be otherwise caused by the absorption of light effected by gas molecules. The area, which includes the gas nozzle 102, the laser-focusing point 103, and the reflecting mirror 104, is surrounded by the chamber, and a hole is bored through only a portion through which the light flux passes. A duct to aspirate the gas spouted from the gas nozzle 102 is provided. Owing to this arrangement, it is possible to maintain a high degree of vacuum in the chamber. In this embodiment, the multifaceted reflecting mirror, which was manufactured in accordance with the first embodiment, was used as the first multifaceted reflecting mirror. However, it is needless to say that those based on the other embodiments or the modified embodiments thereof may be used. Especially, the multifaceted reflecting mirror manufactured in accordance with the first embodiment has the following advantage. That is, the multifaceted reflecting mirror can be installed with the magnetic force in the chamber of the exposure apparatus or on the support stand of the illumination optical system, because the base plate is composed of the magnet. Therefore, such a multifaceted reflecting mirror is extremely advantageous to adjust the optical path of the illumination optical system and perform the maintenance for the multifaceted reflecting mirror. Details of such an exposure apparatus are disclosed, for example, in U.S. Pat. No. 5,581,605. The disclosure of the United States Patent is incorporated herein by reference within a range of permission of the laws and ordinances of the designated state or the selected state designated or selected in this international application.

In the embodiments described above, several materials have been exemplified for the magnet and the magnetic member. However, there is no limitation thereto. It is possible to use a variety of materials. Especially, it is desirable to use those having high Curie temperatures in order to maintain an appropriate coercive force when the heat is applied by the light radiation or the heat conduction. For example, it is desirable to use those having Curie temperatures of not less than 150° C. and preferably not less than 200° C.

As described above, the multifaceted reflecting mirror, which is provided with the reflecting mirror elements, can be easily manufactured with a high degree of positional accuracy by arranging the reflecting mirror elements on the base plate with the magnetic force. When any partial inconvenience arises in the reflecting mirror element after arranging the reflecting mirror elements, then it is easy to replace the reflecting mirror element in one unit, and it is easy to perform the maintenance as well. When the illuminating apparatus, in which the multifaceted reflecting mirror of the present invention is incorporated, is used, it is possible to effect the uniform illumination and the uniform exposure. Accordingly, the exposure apparatus, which is based on the use of the illuminating apparatus according to the present invention, makes it possible to improve the optical characteristics and realize the high throughput brought about by shortening the exposure time. Especially, in the case of the exposure apparatus based on the use of the light source of the short wavelength light beam such as the soft X-ray, it is necessary to provide the vacuum atmosphere in the chamber of the exposure apparatus. Therefore, the exposure apparatus, which is provided with the multifaceted reflecting mirror of the present invention constructed by using no adhesive, is extremely useful to perform the exposure of the circuit pattern having the narrow line width.

What is claimed is:

1. A multifaceted reflecting mirror comprising:
   a plurality of reflecting mirror elements each of which is provided with a reflecting surface; and
   a placement plate which is joined directly to the reflecting mirror elements with magnetic force, wherein:
   the reflecting mirror elements are arranged adjacently on the placement plate which is common to the plurality of reflecting mirror elements, the reflecting mirror elements are individually joined to the placement plate so that each of the reflecting mirror elements can be individually removed from the placement plate, and at least some of the plurality of reflecting mirror elements abut against adjacent ones of the plurality of reflecting mirror elements.

2. The multifaceted reflecting mirror according to claim 1, further comprising, on the placement plate, a positioning member which positions at least one of the reflecting mirror elements on the placement plate.

3. The multifaceted reflecting mirror according to claim 1, wherein the placement plate includes a magnet.

4. The multifaceted reflecting mirror according to claim 3, wherein a magnetic film is formed on a bottom surface of each of the reflecting mirror elements.

5. The multifaceted reflecting mirror according to claim 3, wherein a magnet is embedded in the placement plate.

6. The multifaceted reflecting mirror according to claim 5, wherein a plurality of recesses are formed at predetermined intervals in the placement plate, and the magnet is accommodated in each of the recesses so that the magnet is not exposed to a surface of the placement plate.

7. The multifaceted reflecting mirror according to claim 3, wherein each of the reflecting mirror elements is composed of a magnetic material, magnetic elements are provided between the placement plate and the respective reflecting mirror elements, and the magnetic elements are arranged on the placement plate so that polarities of the adjoining magnetic elements are opposite to one another.

8. The multifaceted reflecting mirror according to claim 1, wherein each of the reflecting mirror elements includes a magnet.

9. The multifaceted reflecting mirror according to claim 1, wherein each of the reflecting mirror elements is formed of a conductor.

10. The multifaceted reflecting mirror according to claim 1, wherein a metal plating is applied to the reflecting surface of each of the reflecting mirror elements.

11. An illumination optical system comprising:
    a first multifaceted reflecting mirror which comprises a plurality of reflecting mirror elements having reflecting surfaces, the plurality of reflecting mirror elements being disposed adjacently on a first placement plate; and
    a second multifaceted reflecting mirror which comprises a plurality of reflecting mirror elements having reflecting surfaces, the plurality of reflecting mirror elements being disposed adjacently on a second placement plate, wherein:
    the respective reflecting mirror elements of the first multifaceted reflecting mirror are fixed with magnetic force directly on the first placement plate which is common to the plurality of reflecting mirror elements of the first multifaceted reflecting mirror, and the reflecting mirror elements of the first multifaceted reflecting mirror are individually joined to the first placement plate so that each of the reflecting mirror elements can be individually removed from the first placement plate.

12. The illumination optical system according to claim 11, wherein the respective reflecting mirror elements of the second multifaceted reflecting mirror are fixed on the second placement plate with magnetic force, and the reflecting mirror elements of the second multifaceted reflecting mirror are individually joined to the second placement plate so that each of the reflecting mirror elements can be individually removed from the second placement plate.

13. The illumination optical system according to claim 12, wherein the reflecting surface of each of the reflecting mirror elements of the first multifaceted reflecting mirror is circular arc-shaped, and the reflecting surface of each of the reflecting mirror elements of the second multifaceted reflecting mirror is rectangular.

14. The illumination optical system according to claim 11, wherein the first placement plate includes a magnet.

15. The illumination optical system according to claim 14, wherein a magnetic film is formed on a bottom surface of each of the reflecting mirror elements of the first multifaceted reflecting mirror.

16. The illumination optical system according to claim 14, wherein a magnet is embedded in the first placement plate.

17. The illumination optical system according to claim 14, wherein each of the reflecting mirror elements of the first multifaceted reflecting mirror is composed of a magnetic material, a magnetic element is provided between the first placement plate and each of the reflecting mirror elements of the first multifaceted reflecting mirror, and the magnetic elements are arranged so that polarities of the adjoining magnetic elements are opposite to one another.

18. The illumination optical system according to claim 11, wherein each of the reflecting mirror elements of the first multifaceted reflecting mirror includes a magnet.

19. The illumination optical system according to claim 11, further comprising, on the first placement plate, a positioning member which determines a position of at least one of the reflecting mirror elements on the first placement plate.

20. The illumination optical system according to claim 11, wherein each of the reflecting mirror elements of the first multifaceted reflecting mirror and the second multifaceted reflecting mirror is formed of a conductor.

21. An exposure apparatus comprising the illumination optical system as defined in claim 11, wherein a substrate is exposed with a mask pattern.

22. The exposure apparatus according to claim 21, wherein a light beam, which is supplied to the illumination optical system, has a wavelength of not more than 200 nm.

23. The exposure apparatus according to claim 22, wherein an atmosphere, in which the illumination optical system in the exposure apparatus is accommodated, is vacuum.

24. The exposure apparatus according to claim 22, further comprising a reflection type projection optical system which projects, onto the substrate, an image of the mask pattern illuminated by the illumination optical system.

25. The exposure apparatus according to claim 24, wherein the reflecting surface of the reflecting mirror element of the first multifaceted reflecting mirror has a shape which is similar to a shape of an optical field of the reflection type projection optical system.

26. A method for producing the multifaceted reflecting mirror as defined in claim 1, comprising:
   forming a reflecting surface on a conductor plate;
   cutting out a plurality of reflecting mirror elements from the conductor plate with electric discharge machining; and
   arranging the reflecting mirror elements on a placement plate which is joined to the reflecting mirror elements with magnetic force so that the reflecting mirror elements are arranged mutually adjacently in accordance with a predetermined pattern.

27. The method for producing the multifaceted reflecting mirror according to claim 26, further comprising providing a positioning member on the placement plate, wherein at least one of the reflecting mirror elements is pushed against the positioning member to position the reflecting mirror element on the placement plate.

28. The method for producing the multifaceted reflecting mirror according to claim 26, further comprising forming a magnetic film on a bottom surface of the cut out reflecting mirror element.

29. The multifaceted reflecting mirror according to claim 1, wherein the placement plate is joined directly to the plurality of reflecting mirror elements with no movable elements between the placement plate and the plurality of reflecting mirror elements.

30. The illumination optical system according to claim 11, wherein the respective reflecting mirror elements of the first multifaceted reflecting mirror are fixed directly on the first placement plate with no movable elements between the first placement plate and the respective reflecting mirror elements of the first multifaceted reflecting mirror.

31. The illumination optical system according to claim 11, wherein at least some of the plurality of reflecting mirror elements of the first multifaceted reflecting mirror abut against adjacent ones of the plurality of reflecting mirror elements of the first multifaceted reflecting mirror.

* * * * *